United States Patent
Lo et al.

(10) Patent No.: US 10,657,051 B2
(45) Date of Patent: May 19, 2020

(54) MEMORY DEVICE AND OPERATION METHOD THEREOF

(71) Applicant: MACRONIX INTERNATIONAL CO., LTD., Hsinchu (TW)

(72) Inventors: Su-Chueh Lo, Hsinchu (TW); Chun-Yu Liao, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/841,640

(22) Filed: Dec. 14, 2017

(65) Prior Publication Data

US 2019/0188131 A1 Jun. 20, 2019

(51) Int. Cl.
| | |
|---|---|
| G11C 16/26 | (2006.01) |
| G06F 12/06 | (2006.01) |
| G11C 11/417 | (2006.01) |
| G11C 11/16 | (2006.01) |
| G11C 7/20 | (2006.01) |
| G11C 7/10 | (2006.01) |
| G11C 11/413 | (2006.01) |
| G11C 29/50 | (2006.01) |
| G06F 3/06 | (2006.01) |

(52) U.S. Cl.
CPC ........ *G06F 12/0646* (2013.01); *G11C 7/1063* (2013.01); *G11C 7/20* (2013.01); *G11C 11/1659* (2013.01); *G11C 11/1673* (2013.01); *G11C 11/413* (2013.01); *G11C 11/417* (2013.01); *G11C 29/50012* (2013.01); *G06F 2003/0691* (2013.01); *G11C 11/1675* (2013.01)

(58) Field of Classification Search
CPC .................................................. G11C 11/5628
USPC .......................................................... 711/156
See application file for complete search history.

(56) References Cited

U.S. PATENT DOCUMENTS

| | | | |
|---|---|---|---|
| 2005/0018519 A1* | 1/2005 | Nii | G11C 11/417 365/227 |
| 2005/0086440 A1* | 4/2005 | Chan | G11C 16/349 711/156 |
| 2008/0114949 A1* | 5/2008 | Kojo | G11C 16/102 711/154 |
| 2012/0069684 A1 | 3/2012 | Douzaka et al. | |
| 2012/0147669 A1* | 6/2012 | Byeon | G11C 11/5628 365/185.03 |
| 2012/0166776 A1* | 6/2012 | Nakamura | G06F 11/34 712/240 |
| 2013/0301345 A1* | 11/2013 | Noguchi | G11C 11/1675 365/158 |
| 2014/0258597 A1* | 9/2014 | Kim | G11C 11/5642 711/103 |
| 2015/0227313 A1 | 8/2015 | Lee et al. | |
| 2015/0294716 A1* | 10/2015 | Tortorelli | G11C 13/004 365/163 |

(Continued)

*Primary Examiner* — Min Huang
(74) *Attorney, Agent, or Firm* — McClure, Qualey & Rodack, LLP

(57) ABSTRACT

Provided is a memory device including: a memory array, including a flag memory array having a plurality of flag memory cells and a data memory array having a plurality of data memory cells, the corresponding flag memory cells being used to record whether the corresponding data memory cells have been written or not. In initialization, the flag memory array is initialized by the control circuit but the data memory array is not initialized.

16 Claims, 2 Drawing Sheets

(56) References Cited

U.S. PATENT DOCUMENTS

2016/0148674 A1  5/2016  Louie et al.
2018/0059968 A1* 3/2018  Jung .................... G06F 3/0619

* cited by examiner

MEMORY DEVICE AND OPERATION METHOD THEREOF

TECHNICAL FIELD

The disclosure relates in general to a memory device and an operation method thereof.

BACKGROUND

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Data stored in SRAM memory cells is unknown after power up or the SRAM data is not default values after a number of write accesses. Therefore, in some application, SRAM need to be initialized (or reset to a default value) before accessing.

SRAM may be initialized by writing default values (Ex, all "0" or all "1") into SRAM memory cells sequentially (for example, one byte after one byte or one word after one word) before SRAM is used. The sequential initialization process takes a long time to finish the SRAM initialization.

Besides, in order to achieve high speed initialization, SRAM memory cells may be initialized in parallel, i.e. parallel initialization. But it will induce very large current consumption during parallel initialization for high density SRAM because a lot of SRAM memory cells are initialized in parallel. The SRAM initialized data may be not the default values due to the power drop induced by large initialization current. Besides, parallel initialization may further induce crash on power lines due to high current consumption.

Therefore, the application provides a memory device and an operation method thereof, which may achieve high-speed and low current consumption SRAM initialization.

SUMMARY

According to one embodiment, provided is a memory device including: a memory array, including a flag memory array and a data memory array, each of flag memory cells in the flag memory array being mapped to corresponding data memory cells in the data memory array, the corresponding flag memory cells being used to record whether the corresponding data memory cells have been written or not. In initialization, the flag memory array is initialized by the control circuit but the data memory array is not initialized.

According to another embodiment, provided is an operation method for a memory device. The operation method includes: in initialization of the memory device, initializing flag memory cells of a flag memory array of a memory array of the memory device but keeping data memory cells of a data memory array of the memory array of the memory device from being initialized.

Figure 1:
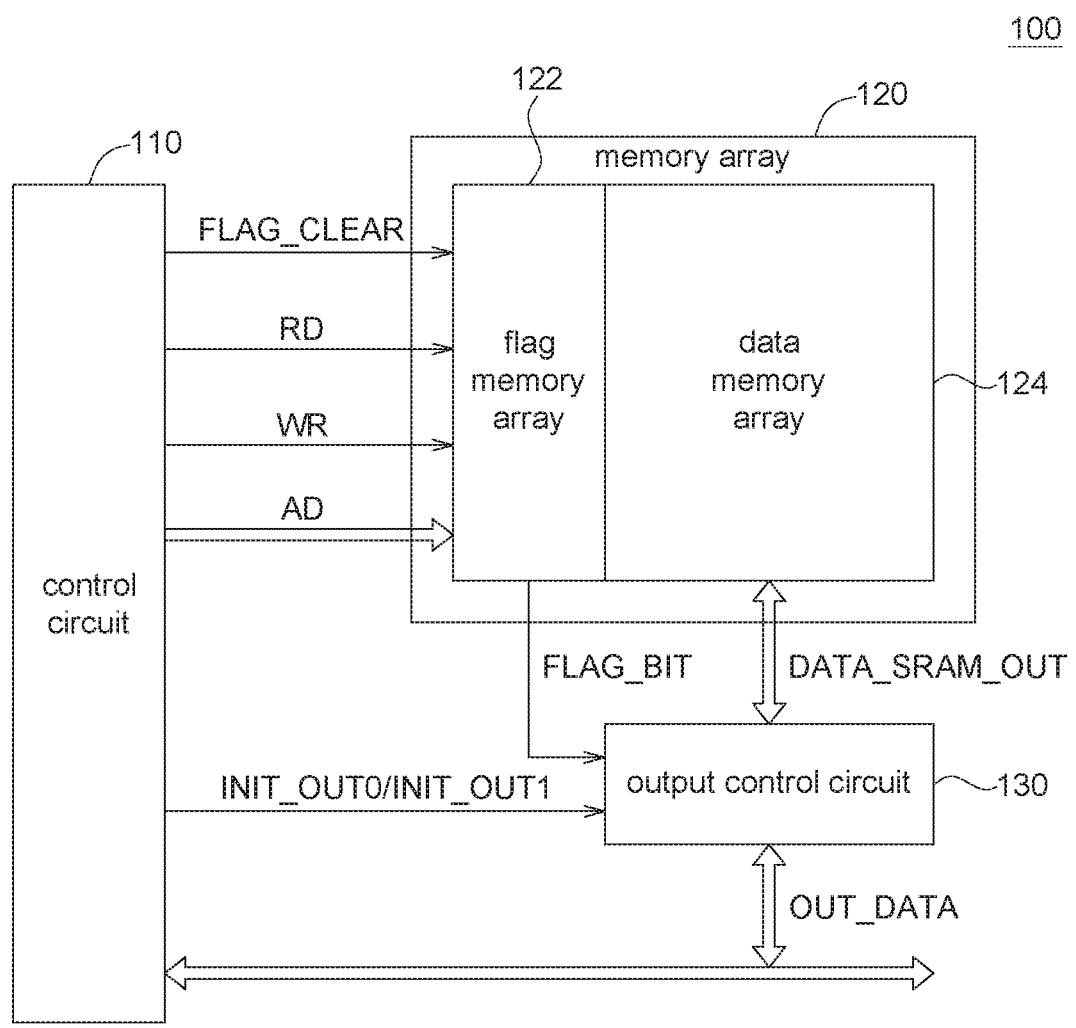
FIG. 1 shows a functional block diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. However, it does not mean that implementation of the disclosure needs every technical feature of any embodiment of the disclosure or combination of the embodiments of the disclosure is prohibited. In other words, in possible implementation, one skilled person in the art would selectively implement part or all technical features of any embodiment of the disclosure or selectively combine part or all technical features of the embodiments of the disclosure.

FIG. 1 shows a functional block diagram of a memory device according to one embodiment of the application. As shown in FIG. 1, the memory device 100 according to one embodiment of the application includes a control circuit 110, a memory array 120 and an output control circuit 130. The memory array 120 further includes a flag memory array 122 and a data memory array 124.

The control circuit 110 is configured to control operations of the memory array 120 and the output control circuit 130. The control circuit 110 is coupled to the memory array 120 and the output control circuit 130. Further, in initialization, the control circuit 110 outputs a flag clear signal FALG_CLEAR to the flag memory array 122 to clear (or initialize) all flag memory cells of the flag memory array 122. In read operation, the control circuit 110 outputs a read command RD and an address signal AD to the data memory array 124 to read from data memory cells of the data memory array 124 and also the flag memory array 122 is read. In write operation, the control circuit 110 outputs a write command WR and an address signal AD to the data memory array 124 to write data into the data memory cells of the data memory array 124, and also, in write operation, the control circuit 110 sets the mapped flag memory cell(s) which are corresponding to the data memory cells that are written.

Further, the control circuit 110 outputs a default value select signal INIT_OUT0 (or INIT_OUT1) to the output control circuit 130 for control the default value (output from the output control circuit 130) as being all "0" or all "1". In the embodiment of the application, the default value select signal INIT_OUT0 is inverted to the default value select signal INIT_OUT1.

The flag memory array 122 of the memory array 120 includes a plurality of flag memory cells. The data memory array 124 of the memory array 120 includes a plurality of data memory cells that are arranged in array.

In the embodiment of the application, each flag memory cell of the flag memory array 122 is mapped to several data memory cells. In the following, for example but not limited by, if in the memory array 120, the data reading/writing unit is byte (or 8 bits or 8 data memory cells), then each flag memory cell is mapped to 8 data memory cells but the application is not limited by. For example, the first eight data memory cells are mapped to the first flag memory cell; the ninth to sixteenth data memory cells are mapped to the second flag memory cell, and so on. Thus, if the data memory array 124 includes N data memory cells (N being a natural number), then the flag memory array 122 includes at least N/8 flag memory cells.

The flag memory cells are used to record whether the corresponding data memory cells have been written or not. That is to say, if the first eight data memory cells are written by the control circuit 110, then the control circuit 110 will also set the first flag memory cell (for example, set to "1"). In other words, if the first flag memory cell is set, it means that the first eight data memory cells have been written by the control circuit 110 after the flag memory array 122 is initialized.

In the embodiment of the application, in initialization, instead of initializing the data memory cells of the data memory array 124, all the flag memory cells in the flag memory array 122 are initialized (for example, initialized or reset to "0") by the control circuit 110 (i.e. the control circuit 110 does not initialize each of the data memory cells in the data memory array 124). Since the flag memory cells in the flag memory array 122 are ⅛ of the data memory cells in the data memory array 124, the initializing current is reduced to be ⅛ (compared to the situation that all the data memory cells in the data memory array 124 are initialized).

When a SRAM read is being requested on the memory array 120 by the control circuit 110, the corresponding flag memory cell in the flag memory array 122 is checked. If the corresponding flag memory cell is "0", the output control circuit 130 outputs the default value (00h (all "0") or FFh (all "1")) as the output data OUT_DATA. On the contrary, when a SRAM read is being requested and if the corresponding flag memory cell is "1", the output control circuit 130 outputs data stored in the corresponding memory cells of the data memory array 124 as the output data OUT_DATA.

That is to say, if the corresponding flag memory cell is set, then the actual content stored in the corresponding data memory cells will be read out as the output data OUT_DATA. On the contrary, if the corresponding flag memory cell is clear, then the actual content stored in the corresponding data memory cells is undefined (due to the data memory array is un-initialized) and thus the default value (all "0" or all "1") will be read out as the output data OUT_DATA.

In more details, when a SRAM read is being requested to read data from the first eight data memory cells and the first flag memory cell is "0" (that is to say, after the flag memory array 122 is initialized, the first eight data memory cells have not been written yet), then the output control circuit 130 outputs the default value (00h or FFh) as the output data OUT_DATA (i.e. data stored in the first eight data memory cells are not read out by the output control circuit 130). On the contrary, when a SRAM read is being requested to read data from the ninth to the sixteenth data memory cells and the second flag memory cell is "1" (that is to say, after the flag memory array 122 is initialized, the ninth to the sixteenth data memory cells have been written), then the output control circuit 130 outputs data stored in the ninth to the sixteenth data memory cells as the output data OUT_DATA (i.e. data stored in the ninth to the sixteenth data memory cells are read out by the output control circuit 130).

In case that the default value select signal INIT_OUT0 is "1" (i.e. the default value select signal INIT_OUT1 is "0"), the output control circuit 130 outputs the default value 00h (all "0") as the output data OUT_DATA when a SRAM read is being requested and when the corresponding flag memory cell is "0". On the contrary, in case that the default value select signal INIT_OUT0 is "0" (i.e. the default value select signal INIT_OUT1 is "1"), the output control circuit 130 outputs the default value FFh (all "1") as the output data OUT_DATA when a SRAM read is being requested and when the corresponding flag memory cell is "0".

Figure 2:
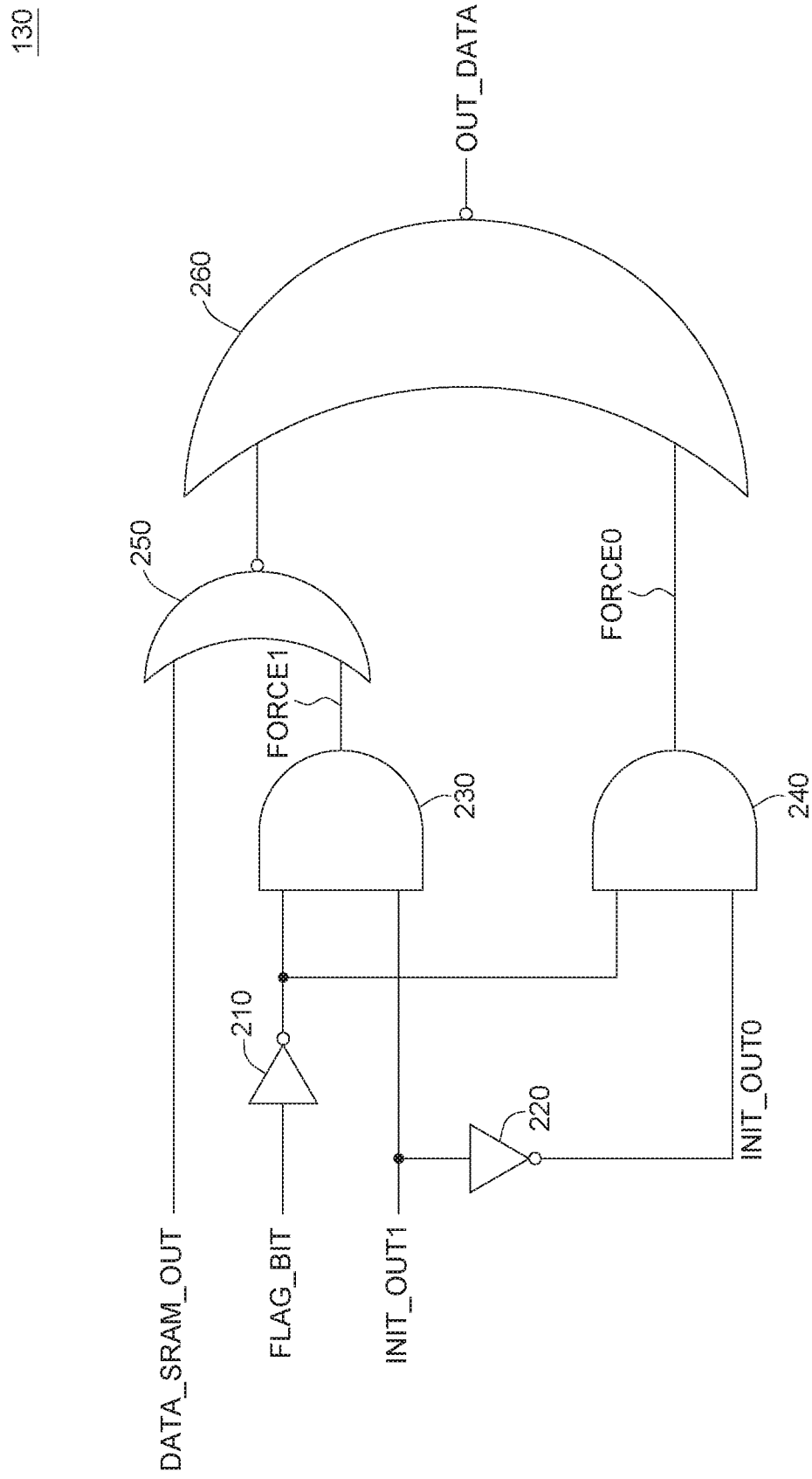
FIG. 2 shows an example of an output control circuit of a memory device according to one embodiment of the application.

FIG. 2 shows an example of an output control circuit of a memory device according to one embodiment of the application. In other possible embodiments of the application, the output control circuit 130 may be implemented by various circuits, which are still within the scope and spirit of the application.

The output data OUT_DATA from the memory device 100 is controlled by the output control circuit 130. The output control circuit 130 includes two inverters 210-220, two AND gates 230-240 and two NOR gates 250-260.

The inverter 210 inverts a flag bit FLAG_BIT. The flag bit FLAG_BIT represents whether the corresponding flag memory cell is set or not. The flag bit FLAG_BIT is "1" if the corresponding flag memory cell is set and vice versa.

The inverter 220 inverts the default value select signal INIT_OUT1 into the default value select signal INIT_OUT0.

The AND gate 230, coupled to the inverter 210, receives the inverted flag bit FLAG_BIT and the default value select signal INIT_OUT1 to output an output signal FORCE 1.

The AND gate 240, coupled to the inverters 210 and 220, receives the inverted flag bit FLAG_BIT and the default value select signal INIT_OUT0 to output an output signal FORCE 0.

The NOR gate 250, coupled to the AND gate 230, receives the output DATA_SRAM_OUT from the corresponding data memory cell of the data memory array 124 and the force signal FORCE 1 from the AND gate 230.

The NOR gate 260, coupled to the AND gate 240 and the NOR gate 250, receives the output from the NOR gate 250 and the force signal FORCE 0 from the AND gate 240, to output the output data OUT_DATA of the output control circuit 130.

The output data OUT_DATA of the output control circuit 130 (i.e. the output data of the memory device 100) will be shown in Table 1.

TABLE 1

| FLAG_BIT | 1 | 1 | 1 | 1 | 0 | 0 | 0 | 0 |
|---|---|---|---|---|---|---|---|---|
| INIT_OUT1 | 1 | 1 | 0 | 0 | 1 | 1 | 0 | 0 |
| DATA_SRAM_OUT | 1 | 0 | 1 | 0 | 1 | 0 | 1 | 0 |
| OUT_DATA | 1 | 0 | 1 | 0 | 1 | 1 | 0 | 0 |

From Table 1, when the flag bit FLAG_BIT is "1", then the actual content of the data memory array 124 will be output by the output control circuit 130 (i.e. OUT_DATA=DATA_SRAM_OUT). When the flag bit FLAG_BIT is "0", then the actual content of the data memory array 124 will be ignored and the output control circuit 130 will output the default value (all "0" when INIT_OUT1=0 or all "1" when INIT_OUT1=1).

The above embodiment and other possible embodiment of the application may also be used in other type memory system (ex. static random access memory (SRAM) or dynamic random access memory (DRAM), or PCM (phase-change memory), or Resistive random-access memory (RRAM), or Magnetoresistive Random Access Memory (MRAM) and etc.).

In brief, in the embodiment of the application, the memory array has at least two partitions: a data memory array (i.e. the data memory array 124) and a flag memory array (i.e. the flag memory array 122). The data memory array will not be initialized in memory initialization process. On the other hand, all flag memory cells in the flag memory array are initialized (to a reset state, ex. "0") in the memory module initialization process. A flag memory cell will be set to a set state (ex. "1") when the control circuit issues a write command on the corresponding data memory cells. When the control circuit issues a read command on the corresponding data memory cells, the output data will be dependent on the state of the corresponding flag memory cell. The output data will be a default value if the flag memory cell is reset (initialized) to the initialized value (ex. "0"); otherwise, the output data will be the actual content of the corresponding data memory cells if the flag memory cell is set.

The embodiments of the application may be designed for NOR flash page buffer, which is an embedded SRAM module. However, the embodiments of the application may also be suitable for a stand-alone SRAM product as well as an embedded SRAM module in a micro-controller chip.

In other possible embodiments of the application, the mapping relation between the flag memory cell and the corresponding data memory cells may be various. For example, in another possible embodiment of the application, one flag memory cell is mapped to 16 data memory cells. Or, in yet another possible embodiment of the application, in the same flag memory array, one or several of the flag memory cells may be mapped to 8 data memory cells while others of the flag memory cells may be mapped to 16 data memory cells. These are still within the spirit and the scope of the application.

As described above, in memory array initialization process, the flag memory array, rather the data memory array, is initialized. Because the flag memory array has fewer memory cells than the data memory array, the time cost and also the power consumption on the initialization process will be lower, compared with the conventional initialization process in which all data memory cells in the data memory array are initialized. That is, the embodiments of the application provide a memory device and an operation method thereof, which may achieve high-speed and low current consumption memory initialization.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device including:
   a memory array, including a flag memory array and a data memory array, each of flag memory cells in the flag memory array being mapped to corresponding data memory cells in the data memory array, the corresponding flag memory cells being used to record whether the corresponding data memory cells have been written or not;
   wherein
   after the memory device is powered up, in initialization, the flag memory array is initialized but the data memory array is not initialized.

2. The memory device according to claim 1, further including:
   a control circuit, coupled to the memory array, for controlling operations of the memory array; and
   an output control circuit, coupled to the memory array and the control circuit, for control outputs of the memory device,
   wherein
   in initialization, the flag memory array is initialized by the control circuit but the data memory array is not initialized; and
   when the control circuit requests a read operation on the memory array, the output control circuit outputs either a default value or data stored in the corresponding data memory cells as an output data based on whether the corresponding flag memory cell is set or not.

3. The memory device according to claim 2, wherein when the corresponding data memory cells are written by the control circuit, the control circuit sets the corresponding flag memory cell.

4. The memory device according to claim 3, wherein when the control circuit requests the read operation on the memory array and the corresponding flag memory cell is set, the output control circuit outputs data stored in the corresponding data memory cells as the output data.

5. The memory device according to claim 3, wherein when the control circuit requests the read operation on the memory array and the corresponding flag memory cell is clear, the output control circuit outputs the default value as the output data.

6. The memory device according to claim 3, wherein the default value includes either a first default value or a second default value, the first default value being all "0" and the second default value being all "1".

7. The memory device according to claim 6, wherein the control circuit controls the output control circuit to output either the first default value or the second default value as the output data when the corresponding flag memory cell is clear.

8. The memory device according to claim 1, wherein the memory device is static random access memory (SRAM) or dynamic random access memory (DRAM) or PCM (phase-change memory) or Resistive random-access memory (RRAM) or Magnetoresistive Random Access Memory (MRAM).

9. The memory device according to claim 2, wherein the output control circuit includes:
   a first inverter for inverting a flag bit representing whether the corresponding flag memory cell is set or not;
   a second inverter for inverting a first default value select signal into a second default value select signal;
   a first AND gate coupled to the first inverter, for receiving the inverted flag bit and the first default value select signal to output a first force signal;
   a second AND gate coupled to the first and the second inverters, for receiving the inverted flag bit and the second default value select signal to output a second force signal;
   a first NOR gate coupled to the first AND gate, for receiving an output from the corresponding data memory cell of the data memory array and the first force signal from the first AND gate; and
   a second NOR gate coupled to the second AND gate and the first NOR gate, for receiving an output from the first NOR gate and the second force signal from the second AND gate to output the output data of the output control circuit.

10. An operation method for a memory device, the operation method including:
    after the memory device is powered up, in initialization of the memory device, initializing flag memory cells of a flag memory array of a memory array of the memory device but keeping data memory cells of a data memory array of the memory array of the memory device from being initialized.

11. The operation method according to claim 10, further including:

requesting a read operation on the memory array to output either a default value or data stored in the corresponding data memory cells as an output data based on whether the corresponding flag memory cell of the flag memory array is set or not.

12. The operation method according to claim 11, wherein when the corresponding data memory cells are written, the corresponding flag memory cell is set.

13. The operation method according to claim 12, wherein when the read operation is requested on the memory array and when the corresponding flag memory cell is set, data stored in the corresponding data memory cells is output as the output data.

14. The operation method according to claim 12, wherein when the read operation is requested on the memory array and when the corresponding flag memory cell is clear, the default value is output as the output data.

15. The operation method according to claim 12, wherein the default value includes either a first default value or a second default value, the first default value being all "0" and the second default value being all "1".

16. The operation method according to claim 12, wherein the memory device is static random access memory (SRAM) or dynamic random access memory (DRAM) or PCM (phase-change memory) or Resistive random-access memory (RRAM) or Magnetoresistive Random Access Memory (MRAM).

* * * * *